United States Patent
Chen et al.

(10) Patent No.: US 12,152,098 B2
(45) Date of Patent: Nov. 26, 2024

(54) CONDUCTIVE POLYMER NANOPARTICLES AND USE THEREOF

(71) Applicant: ETERNAL MATERIALS CO., LTD., Kaohsiung (TW)

(72) Inventors: Shinn-Horng Chen, Kaohsiung (TW); An-I Tsai, Kaohsiung (TW); Huan-Te Chiang, Kaohsiung (TW); Tzi-Yi Wu, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 649 days.

(21) Appl. No.: 17/149,352

(22) Filed: Jan. 14, 2021

(65) Prior Publication Data

US 2021/0221933 A1 Jul. 22, 2021

(30) Foreign Application Priority Data

Jan. 17, 2020 (TW) .................................. 109101831

(51) Int. Cl.
*H01B 1/12* (2006.01)
*C08F 257/02* (2006.01)
(Continued)

(52) U.S. Cl.
CPC .............. *C08F 257/02* (2013.01); *C09D 5/24* (2013.01); *C09D 151/003* (2013.01);
(Continued)

(58) Field of Classification Search
CPC . H01B 1/127; H01B 1/128; C08G 2261/1424
See application file for complete search history.

(56) References Cited

U.S. PATENT DOCUMENTS 4,986,886 A * 1/1991 Wei ...................... C08G 61/126
526/256
8,721,928 B2 * 5/2014 Jonas .................. H10K 85/1135
252/500
(Continued)

FOREIGN PATENT DOCUMENTS

CN 112071650 A * 12/2020 .............. C08F 12/30
JP 2016041780 A * 3/2016
(Continued)

OTHER PUBLICATIONS

Translation of CN-112071650-A (Year: 2020).*
(Continued)

*Primary Examiner* — Hoa (Holly) Le
(74) *Attorney, Agent, or Firm* — LADAS & PARRY LLP

(57) ABSTRACT

The present disclosure provides a conductive polymer material. The conductive polymer material includes a conductive polymer having structural units derived from the following monomers:

(a) a monomer of formula (I):

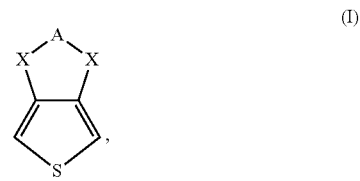

and (b) a monomer having an ethylenically unsaturated group which has the following formula:
(Continued)

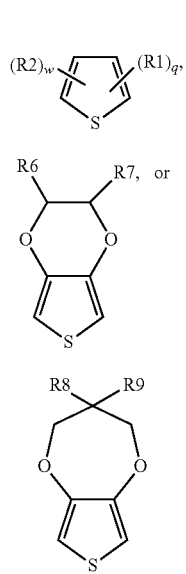

(II)

(III)

(IV)

wherein A, X, R1, R2, R6 to R9, q and w are described in the specification. The conductive polymer material of the present disclosure has high withstand voltage and high capacitance and can be used for the preparation of solid capacitors or hybrid capacitors. In addition, the conductive polymer material according to the present disclosure has high electrical conductivity and good water washing resistance and is thus useful for an antistatic coating or smart fabrics.

20 Claims, 2 Drawing Sheets

(51) Int. Cl.
    *C09D 5/24*     (2006.01)
    *C09D 151/00*     (2006.01)
    *D06N 3/04*     (2006.01)
    *H01G 4/30*     (2006.01)
    *H01G 4/32*     (2006.01)
    *H01G 9/025*     (2006.01)
    *H05K 9/00*     (2006.01)

(52) U.S. Cl.
CPC ....... *D06N 3/045* (2013.01); *D06N 2209/041* (2013.01); *D06N 2209/046* (2013.01); *H01G 4/30* (2013.01); *H01G 4/32* (2013.01); *H01G 9/025* (2013.01); *H05K 9/0079* (2013.01)

(56) References Cited

U.S. PATENT DOCUMENTS

| | | | |
|---|---|---|---|
| 2003/0176628 A1* | 9/2003 | Groenendaal | C07D 495/04 549/29 |
| 2007/0232781 A1* | 10/2007 | Zhu | H10K 85/1135 528/373 |
| 2011/0004943 A1 | 1/2011 | Chaganti et al. | |
| 2011/0049433 A1* | 3/2011 | Jonas | H01G 11/56 252/500 |
| 2012/0033349 A1* | 2/2012 | Petrzilek | H01G 9/012 29/25.03 |
| 2014/0036415 A1* | 2/2014 | Tsai | H01G 9/028 252/500 |

FOREIGN PATENT DOCUMENTS

| | | | | |
|---|---|---|---|---|
| WO | WO-2007066353 A2 * | 6/2007 | ........... | C07D 495/04 |
| WO | WO-2016099109 A1 * | 6/2016 | ............. | H01G 9/004 |

OTHER PUBLICATIONS

Search Report issued in corresponding Taiwanese Patent Application No. 109101831, which cited the reference CN 101977960 A (corresponding to US 2011/0049433 A1). Along with English translation of the TW Search Report.

* cited by examiner

CONDUCTIVE POLYMER NANOPARTICLES AND USE THEREOF

BACKGROUND

1. Field of the Disclosure

The present disclosure relates to a conductive polymer material, in particular to a conductive polymer material useful in solid capacitors, hybrid capacitors (solid-liquid capacitors), antistatic coatings or smart fabrics.

2. Description of the Related Art

Conductive polymers such as polythiophene are polymers with π conjugated double bonds. The delocalized π-electrons in conductive polymers are not bound by atoms, and can move freely on the molecular chain. By doping, the electrons can be removed to generate holes, or the electrons can be added, so that the electrons or holes can move freely on the molecular chain to improve the conductivity. Conductive polymers have been used in various industrial products, such as touch panels, capacitors, solar cells, antistatic coatings, conductive coatings, electrochromic elements, and smart fabrics.

Conventionally, the capacitors can be grouped into liquid capacitors and solid capacitors according to the state of the electrolyte. Although the conventional liquid capacitor has a high capacity, the use is limited due to its high equivalent series resistance (ESR). The solid capacitors, with conventional liquid electrolytes being replaced with solid electrolytes, have high stability, low ESR, low capacitance variability, excellent frequency response (high frequency resistance), high temperature resistance and high current resistance, and can prevent leakage and explosion. In addition, there are also hybrid capacitors obtained by mixing a solid electrolyte and a liquid electrolyte.

One kind of solid electrolyte that has been developed is the conductive copolymer. Because conductive polymers have a higher conductivity than the liquid electrolytes used in conventional electrolytic capacitors or solid semiconductor complex salts such as tetracyanoquinodimethane (TCNQ) complex salts and inorganic semiconductor $MnO_2$, and because they have a suitable high-temperature insulation property, conductive polymers have become a main focus in the development of solid electrolytes today.

Conductive polymer poly-3,4-ethylenedioxythiophene (PEDOT) has the advantages of good heat resistance, high conductivity, fast charge conduction, non-toxicity, long life, and no occurrence of explosion when applied to a capacitor. In the technical field, PEDOT is prepared by directly polymerizing 3,4-ethylenedioxythiophene (EDOT) as a monomer with iron p-toluenesulfonate in a capacitor. There is still a need in the related technical field to develop a conductive polymer material with improved physical properties, which can withstand higher voltages and have good stability.

Conductive polymer materials have both the conductivity of metals and the flexibility of organic polymers. At present, there have been technical proposals for applying conductive polymer PEDOT to smart fabrics as electrode elements. However, generally, conductive polymers are not resistant to water washing. Therefore, there is a need in the related technical field to develop a conductive polymer material with improved water washing resistance.

SUMMARY

The present disclosure provides a conductive polymer material which includes a conductive polymer having structural units derived from the following monomers:

(a) a monomer of formula (I):

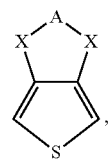

wherein:

X is O or S,

A is $C_{1-4}$ alkylene optionally substituted by $(R)_p$,

R is $C_{1-20}$ alkyl, $C_{1-20}$ alkoxy or $C_{6-20}$ aryl,

P is 0, 1 or 2; and (b) a monomer having an ethylenically unsaturated group which has the following formula:

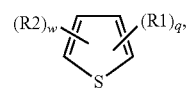

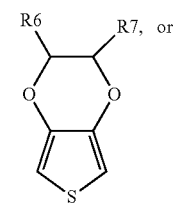

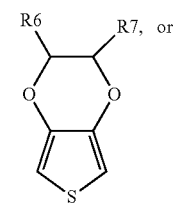

wherein:

R1, R7 and R9 are each independently -D-E-F-G;

R6 and R8 are each independently H, $C_{1-4}$ alkyl or -D-E-F-G;

D is a bond or $C_{1-6}$ alkylene;

E is a bond or $C_{1-20}$ alkoxylene;

F is a bond, —C(=O)—, —O—C(=O)— or —O—C(=O)—O—;

G is —($C_{1-4}$ alkylene)$_y$-CH=CH$_2$;

R2 is $C_{1-20}$ alkyl;

q is 1, 2 or 3;

w is 0 or 1; and y is 0 or 1.

The present disclosure further provides solid capacitors, hybrid capacitors, antistatic coatings or smart fabrics including the above conductive polymer material.

The conductive polymer material of the present disclosure has the characteristics of high withstand voltage and high capacitance, is useful for the preparation of solid capacitors or hybrid capacitors. In addition, the conductive polymer material of the present disclosure has good conductivity and water washing resistance and is applicable to antistatic coatings or smart fabrics.

DETAILED DESCRIPTION

Figure 1:
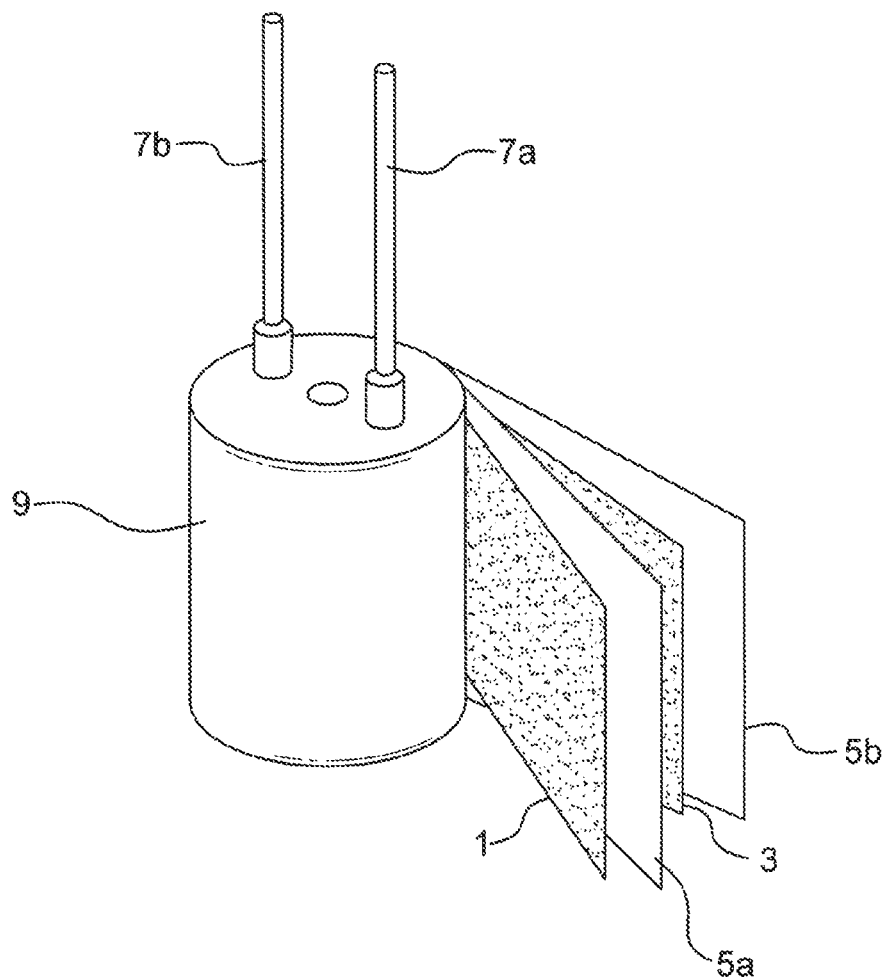
FIG. 1 shows a wound solid capacitor element according to an embodiment of the present invention.

To have a better understanding about the disclosure herein, some terms are defined as follows.

By the term "about," it means the acceptable deviation of a value determined by a person having ordinary skill in the art, partly depending on how to calculate or determine the value.

By the term "alkyl," it means a straight or branched carbon chain radical. In some embodiments, alkyl is a carbon chain radical having 1 to 20 carbons ($C_{1-20}$), 1 to 15 carbons ($C_{1-15}$), 1 to 10 carbons ($C_{1-10}$), 1 to 6 carbons ($C_{1-6}$) or 1 to 4 carbons ($C_{1-4}$). Examples of alkyl include, but are not limited to, methyl, ethyl, propyl (including all the isomer forms), butyl (including all the isomer forms), pentyl (including all the isomer forms), and hexyl (including all the isomer forms).

By the term "alkoxy," it means —O-alkyl where alkyl is as defined hereinabove. Examples of alkoxy include, but are not limited to methoxy, ethoxy, propoxy (including all the isomer forms), and butoxy (including all the isomer forms).

By the term "aryl," it means mono-cyclic or multi-cyclic, monovalent aromatic radical. In some embodiments, an aryl has 6 to 20 ($C_{6-20}$), 6 to 15 ($C_{6-15}$), or 6 to 10 ($C_{6-10}$) ring atoms. Examples of aryl include, but are not limited to, phenyl, naphthyl, fluorenyl, azulenyl, anthracyl, phenanthryl, pyrenyl, biphenyl, and terphenyl. It also means a bicyclic or tricyclic carbon ring, one of whose rings is an aromatic ring and the other one or two rings are saturated, partially unsaturated, or aromatic rings, such as dihydronaphthyl, indenyl, dihydroindenyl, and tetrahydronaphthyl.

The term "optionally substituted" or "optionally substituted by . . . " refers to a radical or ring which is unsubstituted and a radical or ring which is substituted by one or more specific substituents.

Some embodiments according to the present invention will be illustrated as follows. However, without departing from the spirit of the invention, the invention also encompasses various practical embodiments and should not be construed to be limited to those described in the specification. Moreover, unless otherwise described, "a," "an," or "the" or the like will represent singular or plural form. In addition, for the sake of clarity, the sizes of the elements and regions shown in the drawing can be magnified, rather than being drawn according to the actual proportion.

Conductive Polymer Material

The present disclosure provides a conductive polymer material which includes a conductive polymer having structural units derived from the following monomers: (a) a monomer of formula (I); and (b) a monomer having an ethylenically unsaturated group (a monomer of formula (II), (III) or (IV)).

The conductive polymer material according to the present disclosure has a structural unit derived from a monomer of formula (I) (a thiophene derivative):

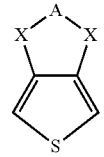
(I)

wherein:
A is a $C_{1-4}$ alkylene optionally substituted by $(R)_p$, and preferably methylene or ethylene;
X is O or S;
R is $C_{1-20}$ alkyl or $C_{1-20}$ alkoxy, or $C_{6-20}$ aryl, preferably $C_{1-15}$ alkyl or $C_{1-15}$ alkoxy, or $C_{6-15}$ aryl, and more preferably $C_{1-3}$ alkyl or $C_{1-3}$ alkoxy, or $C_{6-10}$ aryl; and
p is 0, 1 or 2.

The monomer of formula (I) preferably includes, but is not limited to:

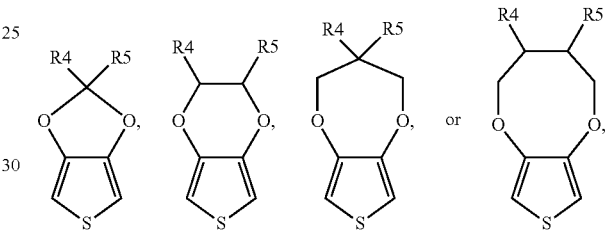

or a combination thereof, wherein R4 and R5 are each independently H, $C_{1-15}$ alkyl or $C_{1-15}$ alkoxy, or $C_{6-15}$ aryl. Preferably, R4 and R5 are each independently H, $C_{1-3}$ alkyl or $C_{1-3}$ alkoxy.

According to an embodiment of the present disclosure, the monomer (I) can be, for example, but not limited to:

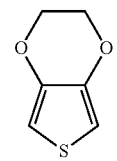

(3,4-ethylenedioxythiophene, EDOT),

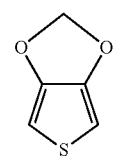

(thieno [3,4-d][1,3]dioxole), or

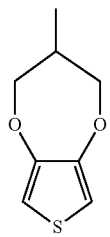

(3-methyl-3,4-dihydro-2H-thieno[3,4-b][1,4]dioxepine), or a combination thereof.

In one embodiment of the present disclosure, the conductive polymer material of the present disclosure includes the conductive polymer of the present disclosure and polyanion. The polyanion can form a complex with the conductive polymer material. By using a polyanion during polymerization, the originally water-insoluble polythiophene compound can be easily water-dispersed or waterborne, and the resulting conductive polymer complex has good conductivity. The polyanion used in the present disclosure is not particularly limited, and can be those known to a person having ordinary knowledge in art. The polyanion which is useful in the present disclosure may be an acidic polymer in free acid form. The acidic polymer includes, for example, but is not limited to, polycarboxylic acid, polysulfonic acid or a combination thereof. The polycarboxylic acid is, for example, polyacrylic acid, polymethacrylic acid or polymaleic acid. The polysulfonic acid is, for example, polystyrene sulfonic acid (PSS) or polyvinyl sulfonic acid. In terms of the conductivity, polystyrene sulfonic acid is most preferred. In the present disclosure, polyanions in a form in which the free acid moiety is neutralized into a salt can also be used.

When a conductive polymer (for example, the conductive polymer poly-3,4-ethylenedioxythiophene (PEDOT)) is used alone, the conductivity is not high in nature, and is about 1 S/cm. A polyanion (for example, polystyrene sulfonic acid (PSS)) needs to be added to form a complex material, referred to as PEDOT:PSS, to reduce the energy level and increase the conductivity to 100 S/cm, while not compromising the conductivity and the stretchability. However, the material characteristics of PEDOT:PSS are not resistant to water washing and solvent wiping. To resolve the problem of poor water washing resistance of conductive polymers, the present inventors find that the stability and withstand voltage of a conductive polymer can be enhanced, and the water washing resistance of the conductive polymer can be improved as well, by introducing an ethylenically unsaturated group, which undergoes crosslinking when heated, to the conductive polymer structure.

Therefore, in addition to the structural unit derived from the monomer of Formula (I), the conductive polymer of the present disclosure also has a structural unit derived from a monomer having an ethylenically unsaturated group. In the present disclosure, an ethylenically unsaturated group is introduced into the conductive polymer structure, the monomer having an ethylenically unsaturated group used has no impact on the original characteristics of the conductive polymer and can be cross-linked when heated, and therefore, the water washing resistance of the conductive polymer can be effectively improved. In addition, it has also been found that the use of the monomers having an ethylenically unsaturated group can improve the stability and withstand voltage of the conductive polymer.

The monomer having an ethylenically unsaturated group can be a monomer of Formula (II), (III) or (IV):

(II)

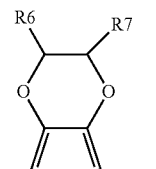

(III)

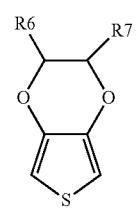

(IV)

wherein:
R1, R7 and R9 are each independently -D-E-F-G;
R6 and R8 are each independently H, $C_{1-4}$ alkyl or -D-E-F-G;
D is a bond or $C_{1-6}$ alkylene, preferably a bond or $C_{1-4}$ alkylene, and more preferably methylene, ethylene, or propylene;
E is a bond or $C_{1-20}$ alkoxylene, and preferably a bond or $C_{1-15}$ alkoxylene;
F is a bond, —C(=O)—, —O—C(=O)— or —O—C(=O)—O—;
G is —($C_{1-4}$ alkylene)$_y$-CH=CH$_2$;
R2 is $C_{1-20}$ alkyl, preferably $C_{1-10}$ alkyl, and more preferably $C_{1-6}$ alkyl;
q is 1, 2 or 3;
w is 0 or 1; and
y is 0 or 1.

In a specific embodiment of the present disclosure, R1 is each preferably independently:

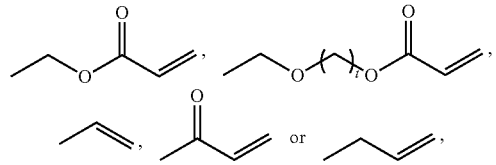

in which t is an integer of 1-20, preferably an integer of 1-16.

In a specific embodiment of the present disclosure, R7 and R9 are each preferably independently:

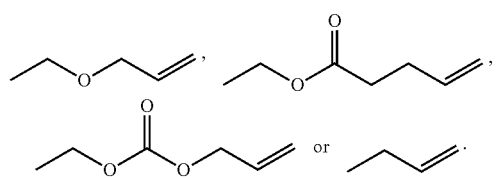

In a specific embodiment of the present disclosure, R6 and R8 are each preferably independently: H, $C_{1-4}$ alkyl or $-(C_{1-4}\text{ alkylene})_y\text{-CH}=\text{CH}_2$, in which y is 0 or 1; and more preferably R6 and R8 are each independently H, methyl, ethyl, $-\text{CH}_2-\text{CH}=\text{CH}_2$ or $-\text{C}_2\text{H}_4-\text{CH}=\text{CH}_2$.

In a specific embodiment of the present disclosure, G is preferably $-\text{CH}=\text{CH}_2$, $-\text{CH}_2-\text{CH}=\text{CH}_2$ or $-\text{C}_2\text{H}_4-\text{CH}=\text{CH}_2$.

According to a specific embodiment of the present disclosure, the monomer having an ethylenically unsaturated group includes the monomer of Formula (II), in which R1, R2, q and w are as defined above.

According to a specific embodiment of the present disclosure, the monomer having an ethylenically unsaturated group includes the monomer of Formula (III), in which R6 and R7 are as defined above.

According to a specific embodiment of the present disclosure, the monomer having an ethylenically unsaturated group includes the monomer of Formula (IV), in which R8 and R9 are as defined above.

According to a specific embodiment of the present disclosure, the monomer having an ethylenically unsaturated group includes at least one of the monomer of Formula (II), the monomer of Formula (III), and the monomer of Formula (IV).

According to a specific embodiment of the present disclosure, specific examples of the monomer having an ethylenically unsaturated group include, but are not limited to:

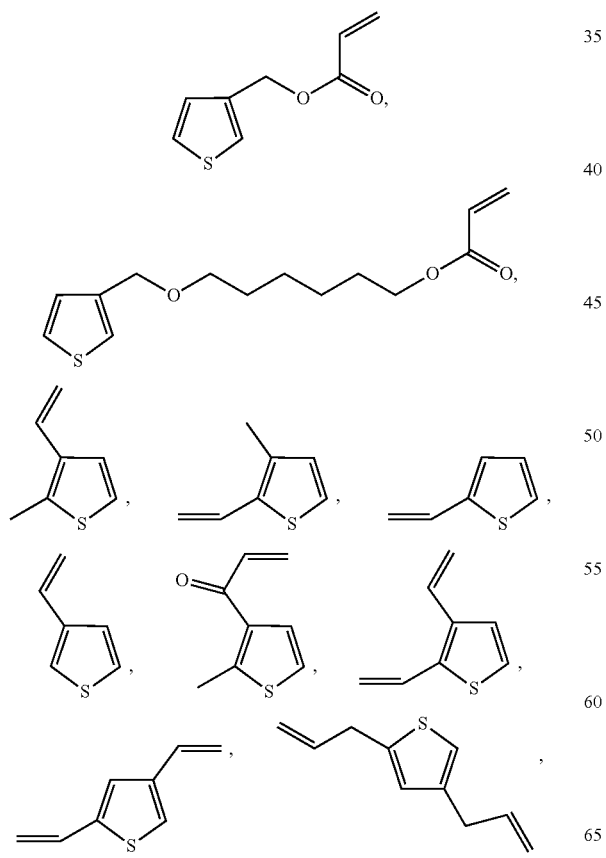

-continued

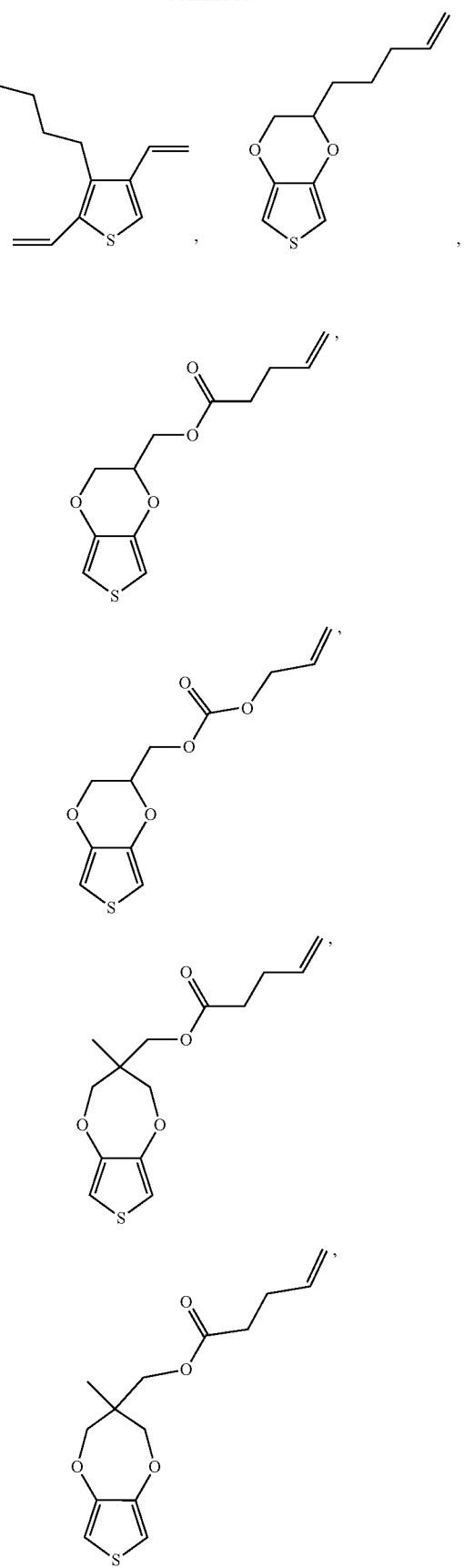

-continued

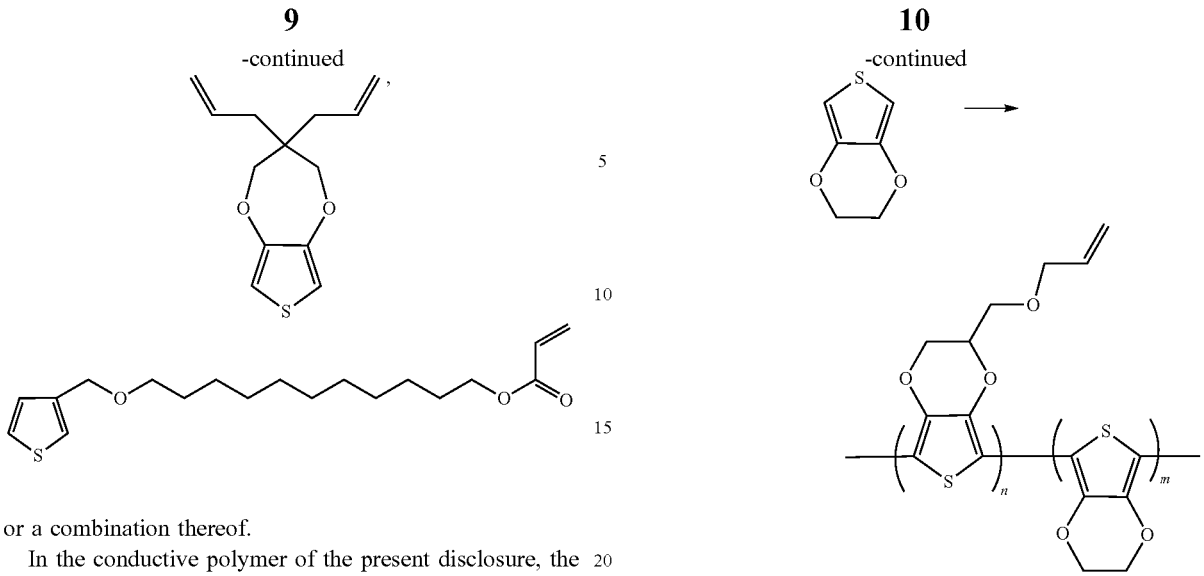

or a combination thereof.

In the conductive polymer of the present disclosure, the structural units derived from the monomer of Formula (I) and the structural units derived from the monomer of Formula (II), (III) or (IV) can be arranged randomly or regularly.

In Scheme 1, a reaction scheme to prepare the conductive polymer of the present disclosure is described with the monomer of Formula (I)

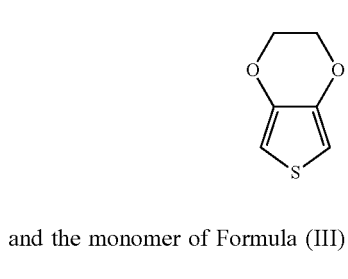

and the monomer of Formula (III)

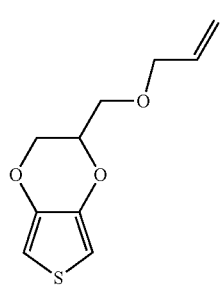

as an example:

Scheme 1 where m and n are the numbers of moles of the monomers of Formula (I) and Formula (III) respectively, and the structural formula of the reaction product may represent that the monomers of Formula (I) and Formula (III) are arranged randomly or regularly (for example, but not limited to: an arrangement of consecutive m monomers of Formula (I) and consecutive n monomers of Formula (III)).

According to some preferred embodiments of the present disclosure, the weight average molecular weight of the conductive polymer of the present disclosure is between 75,000 and 500,000; for example, 75,000, 100,000, 150,000, 200,000, 300,000, 400,000 or 500,000, and preferably between 75,000 and 150,000. Generally speaking, an excessively small molecular weight may lead to poor conductivity and poor coatability, and an excessively large molecular weight may affect the permeability and impregnation ratio of the conductive polymer (for example, a poor impregnation ratio for the resulting capacitor).

According to some preferred embodiments of the present disclosure, the mole ratio of the monomer of Formula (I) (component (a)) to the monomer having an ethylenically unsaturated group (component (b)) used to form the conductive polymer of the present disclosure ranges from 1:1 to 1:0.005; for example, 1:1, 1:0.8, 1:0.5, 1:0.3, 1:0.2, 1:0.1, 1:0.05, 1:0.02, 1:0.01, 1:0.008 or 1:0.005, and preferably between 1:0.5 and 1:0.02.

In one embodiment of the present disclosure, the conductive polymer material of the present disclosure includes the conductive polymer of the present disclosure and polyanion. The polyanion can form a complex with the conductive polymer material. By using a polyanion during polymerization, the originally water-insoluble polythiophene compound can be easily water-dispersed or waterborne, and the resulting conductive polymer complex has good conductivity. The polyanion used in the present disclosure is not particularly limited, and can be those known to a person having ordinary knowledge in art. The polyanion which is useful in the present disclosure may be an acidic polymer in free acid form. The acidic polymer includes, for example, but is not limited to, polycarboxylic acid, polysulfonic acid or a combination thereof. The polycarboxylic acid is, for example, polyacrylic acid, polymethacrylic acid or polymaleic acid. The polysulfonic acid is, for example, polystyrene sulfonic acid or polyvinyl sulfonic acid. In terms of the conductivity, polystyrene sulfonic acid is most preferred. In the present disclosure, polyanions in a form in which the free acid moiety is neutralized into a salt can also be used.

The molecular weight of the polycarboxylic acid or polysulfonic acid used as the polyanion is not particularly limited. However, in terms of the conductivity, the preferred weight average molecular weight is in the range of about 10,000 to about 150,000, and more preferably in the range of about 70,000 to about 100,000.

According to some preferred embodiments of the present disclosure, the weight ratio of the conductive polymer to the polyanion is in the range of about 0.05 to about 10, preferably in the range of about 0.1 to about 8, and more preferably in the range of about 0.2 to about 5.

According to some preferred embodiments of the present disclosure, the conductive polymer material of the present disclosure has an average particle size (d50) ranging from about 10 nm to about 100 nm, such as 10 nm, 20 nm, 30 nm, 40 nm, 50 nm, 60 nm, 70 nm, 80 nm, 90 nm or 100 nm, and preferably in the range of 10 nm to 80 nm. A particle size that is too large will affect the permeability and impregnation ratio of the conductive polymer (for example, a poor impregnation ratio for the resulting capacitor), resulting in a poor storage capacity of the capacitor. The average particle size (d50) refers to a particle size at a cumulative volume distribution of 50% (i.e., average particle size or median diameter) in the particle size distribution measured by a laser diffraction method.

According to some preferred embodiments of the present disclosure, the conductive polymer material of the present disclosure may optionally include a divinyl ester or divinyl ether additive. The addition of a material having two-terminal double bonds can further enhance the ratio of cross-linking between polymers to improve the withstand voltage and water washing resistance. According to a specific embodiment of the present disclosure, the divinyl ester and divinyl ether have a structure of Formula (V) and (VI):

(V)

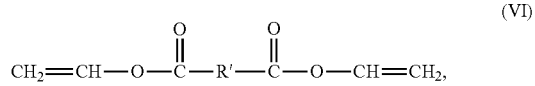

(VI)

respectively, where R' is $C_{1-20}$ alkylene or $C_{3-10}$ cycloalkylene, or $C_{1-20}$ alkylene in which two adjacent carbon atoms are optionally interrupted by $C_{3-10}$ cycloalkylene.

According to a specific embodiment of the present disclosure, specific examples of the divinyl ester and divinyl ether include, but are not limited to:

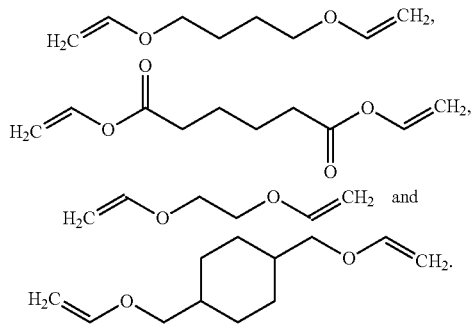

According to some preferred embodiments of the present disclosure, the mole ratio of the monomer of Formula (I) (component (a)) to the divinyl ester or divinyl ether additive is between 1:1 and 1:0.001; for example, 1:1, 1:0.5, 1:0.1, 1:0.05, 1:0.01, 1:0.005 or 1:0.001, and preferably between 1:0.5 and 1:0.005.

According to some preferred embodiments of the present disclosure, the conductive polymer material of the present disclosure may optionally include an oxidant. The oxidant, which is useful in the oxidative polymerization reaction of the monomer of Formula (I) and the specific monomer having an ethylenically unsaturated group, is not particularly limited, as long as it can promote the progression of the oxidative polymerization reaction. For example, the oxidant useful in the present disclosure can be selected from the group consisting of, without limitation, alkali metal persulfates, ammonium salts, peroxides, trivalent iron salts of organic acids and combinations thereof. Preferred oxidants are iron p-toluenesulfonate, ammonium sulfate, ammonium persulfate, ammonium oxalate, ammonium perchlorate, hydrogen peroxide, sodium peroxydisulfate, potassium peroxydisulfate or a mixture thereof. According to a specific embodiment of the present disclosure, the oxidant used in the present disclosure is sodium peroxydisulfate, or potassium peroxydisulfate.

The conductive polymer of the present disclosure has structural units derived from the monomer of Formula (I) and the specific monomer having an ethylenically unsaturated group. The stability and withstand voltage of the conductive polymer can be further enhanced and the water washing resistance of the conductive polymer can be improved by cross linking the ethylenically unsaturated group on the conductive polymer structure via heating. Therefore, the conductive polymer of the present disclosure can be applied to solid capacitors, smart fabrics and antistatic coatings. In addition, the conductive polymer material of the present disclosure has a nano-scale size, a high molecular weight and excellent conductivity, so it can effectively fill the surface or pores of a dielectric layer on an anode foil or a smart fabric. The solid capacitor made of the conductive polymer material of the present disclosure has a high withstand voltage (for example, the wound capacitor has a withstand voltage of up to 230 V or 250 V or more), so it can be applied to a work environment where a higher voltage is involved.

Preparation of Conductive Polymer Material

The conductive polymer of the present disclosure can be prepared by any suitable method. The description is made with the following method as an example, but the preparation method of the conductive polymer of the present disclosure is not limited thereto. The method includes:

(i) mixing a monomer of Formula (I), a monomer having an ethylenically unsaturated group, and a polyanion solution; and (ii) adding an oxidant (optionally) and oxidatively polymerizing the monomer of Formula (I) and the monomer having an ethylenically unsaturated group to prepare the conductive polymer of the present disclosure and form a complex with the polyanion.

The types, preferred embodiments and amounts of the monomer of Formula (I), the monomer having an ethylenically unsaturated group, and the polyanion used in Step (i) are as defined hereinabove.

According to the present disclosure, Steps (i) and (ii) can be carried out at room temperature. The polyanion is an acidic polymer in free form, which is formed by adding an acidic polymer to a solvent to form a solution, and then dissociating the acidic polymer in the solution. The acidic polymer is as defined hereinabove.

The solvent useful in the present disclosure is not particularly limited in principle, and includes, for example, but is not limited to, water, alcohol, benzene or a combination thereof, preferably methanol, ethanol, propanol, n-butanol, tert-butanol, water or a combination thereof, and more preferably water.

In Step (ii), the monomers can form a conductive polymer by oxidative polymerization in the presence of an oxidant. The resulting conductive polymer is positively charged due to the oxidative polymerization, so it can form a polymer material with the negatively charged polyanion.

The oxidants used in the present disclosure are not particularly limited, and can be those well-known to a person with ordinary knowledge in the art. The oxidants can be, for example, but not limited to, alkali metal persulfates, ammonium salts, peroxides, trivalent iron salts of organic acids or combinations thereof. Preferred oxidants are iron p-toluenesulfonate, ammonium sulfate, ammonium persulfate, ammonium oxalate, ammonium perchlorate, hydrogen peroxide, sodium peroxydisulfate, potassium peroxydisulfate or a mixture thereof. According to a specific embodiment of the present disclosure, the oxidant used in the present disclosure is sodium peroxydisulfate, or potassium peroxydisulfate.

The amount of the oxidant, based on 100 parts by weight of the total monomers (the monomer of Formula (I) and the monomer having an ethylenically unsaturated group), ranges from about 5 parts by weight to about 3000 parts by weight, preferably about 50 parts by weight to about 1000 parts by weight, and most preferably about 100 parts by weight to about 200 parts by weight.

According to another embodiment of the present disclosure, the monomer of Formula (I) can be polymerized first, and then the monomer having an ethylenically unsaturated group is added to participate in the polymerization reaction. The preparation steps are as follows:
(i) mixing a monomer of Formula (I) and a polyanion solution;
(ii) adding an oxidant (optionally) and oxidatively polymerizing the monomer of Formula (I); and
(iii) adding a monomer having an ethylenically unsaturated group and carrying out oxidative polymerization to prepare the conductive polymer of the present disclosure and form a complex with the polyanion.

Steps (i), (ii) and (iii) can be carried out at room temperature. The types, preferred embodiments and amounts of the monomer of Formula (I), the monomer having an ethylenically unsaturated group, the polyanion, the oxidant, and the solvent are as defined herein above.

Application of Conductive Polymer Material

The conductive polymer of the present disclosure can be used directly after preparation, which is impregnated to prepare a capacitor, or used as antistatic coatings or applied to smart fabrics. If necessary, the conductive polymer can be used after formulation with a solvent, a co-solvent or an additive.

The solvent is preferably water.

The co-solvent may be a protic solvent, such as an alcohol.

The additive includes, for example, but is not limited to: a solvent-type adhesive, such as a polyacrylate, a polyester, and a polyurethane; a water-based adhesive, such as polyvinyl alcohol; an additive that can improve the conductivity, such as ethylene glycol, glycerin, sulphone and sulfoxide (for example, dimethyl sulfoxide), a sugar (such as sucrose, glucose, fructose, and lactose) or a sugar alcohol (such as xylitol, erythritol, and sorbitol); and a divinyl ester or divinyl ether thereof.

In one embodiment of the present disclosure, the additive used is a divinyl ester or divinyl ether. The divinyl ester or divinyl ether has double bonds at both ends, which can react with the double bonds on the conductive polymer to further increase the ratio of crosslinking between the polymers to improve the withstand voltage, water washing resistance and other functions.

The conductive polymer material of the present disclosure can be used in smart fabrics, antistatic coatings, solid capacitors or hybrid capacitors.

The conductive polymer material of the present disclosure comprises a conductive polymer having structural units derived from a monomer of Formula (I) and a specific monomer having an ethylenically unsaturated group. The stability and withstand voltage of the conductive polymer can be further enhanced, and the water washing resistance of the conductive polymer can be improved by cross linking the ethylenically unsaturated group on the conductive polymer structure via heating. Therefore, the conductive polymer of the present disclosure can be applied to smart fabrics and antistatic coatings.

In addition, the conductive polymer material of the present disclosure has the characteristics of high withstand voltage and high capacity, and is particularly suitable for preparing solid capacitors with high withstand voltage (or breakdown voltage) and high capacity.

Given the above, the present disclosure further provides a solid capacitor, including: an anode; a dielectric layer formed on the anode; a cathode; and a solid electrolyte located between the dielectric layer and the cathode, wherein the solid electrolyte includes the above-mentioned conductive polymer material of the present disclosure. The solid capacitor may be a wound solid capacitor or a stacked solid capacitor.

Specifically, as the main part of the solid capacitor, the anode is formed by, with an etched conductive metal foil as an anode foil, performing anode oxidation processing on a surface of the anode foil and introducing a wire from the anode foil, and the cathode is formed by, with another metal foil as a cathode foil, introducing a wire from the cathode foil. The dielectric layer is formed from an oxide or the like and is formed on the surface of the anode foil, and is located between the anode foil and the cathode foil. The anode foil and the cathode foil are formed from aluminum, tantalum, niobium, aluminum oxide, tantalum oxide, niobium oxide, titanium plated aluminum, or carbon plated aluminum. The wound solid capacitor may be formed through the following steps: the anode foil and the cathode foil are wound into a cylinder as the main part of the solid capacitor and immersed in a solution containing the conductive polymer material of the present disclosure, and then the solvent is removed, for example, by evacuation and heating. If necessary, the above-mentioned steps can be repeated two to three or more times, thereby forming a solid electrolyte between the dielectric layer and the cathode foil of the solid capacitor.

The solid capacitor may be an aluminum solid capacitor, a tantalum solid capacitor, or a niobium solid capacitor.

After the solid electrolyte is formed in the capacitor element, a solid capacitor may be formed by using conventional technologies and materials. For example, the capacitor element may be installed in a box with a bottom, and a seal element with an opening for exposing the wires may be disposed at the top of the box, and a solid capacitor may be formed after being sealed.

The description below is made, together with the accompanying drawings, to illustrate the examples of solid capacitors and a method for preparing solid capacitors according to some preferred embodiments of the present disclosure, which are provided for illustration purposes but not intended to limit the scope of the present invention. Any modifications or alterations that can be easily accomplished by a person skilled in the art fall within the scope of the disclosure of the specification and the appended claims.

FIG. 1 shows a wound capacitor element according to an embodiment of the present disclosure. As shown in FIG. 1, an anode foil 1 and a cathode foil 3 and spacer components 5a and 5b that are inserted between the anode foil 1 and the cathode foil 3 are wound together to form a capacitor element 9. Wires 7a and 7b serve as terminals for connecting the cathode foil 3 and the anode foil 1 to an external circuit.

The number of wires connected to the cathode foil and the anode foil is not particularly limited, provided that the cathode foil and the anode foil both are wire connected. The number of the cathode foils and the anode foils is not particularly limited, either, and for example, the number of the cathode foils may be the same as that of the anode foils, or the number of the cathode foils may be greater than that of the anode foils. The dielectric layer (not shown) formed from an oxide or the like is formed on the surface of the anode foil, and is located between the anode foil and the cathode foil. The anode foil 1, the cathode foil 3, the spacer components 5a and 5b, and the wires 7a and 7b are manufactured by using known materials through known technologies.

The capacitor element 9 is immersed in a solution containing the conductive polymer material according to the present disclosure so that a solid electrolyte is formed between the dielectric layer and the cathode foil of the solid capacitor.

The wound solid capacitor manufactured with the conductive polymer material according to the present disclosure exhibits a high withstand voltage and high capacitance and can be used under a voltage of 230V or 250V or higher and meet the current demands in industry. Therefore, the solid capacitor according to the present disclosure can be widely used in industries requiring high-voltage capacitors, for example, drive power supplies for LED lamps, electronic energy-saving lamps and rectifiers, motor electronic devices, computer motherboards, frequency converters, network communications, power supplies for medical devices, and other high-end areas including UPS.

Figure 2:
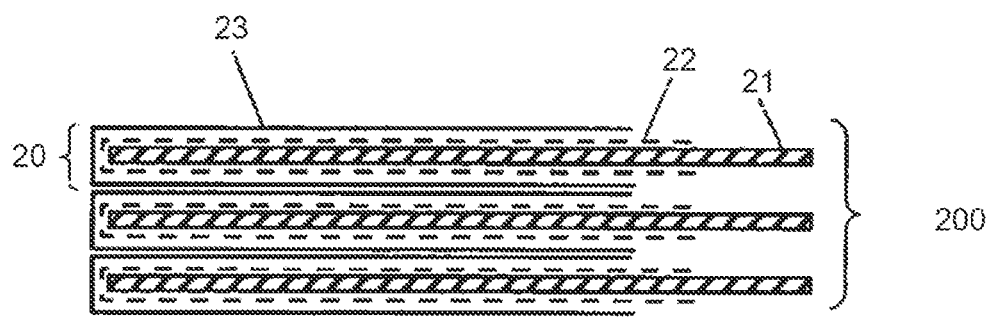
FIG. 2 shows a stacked solid capacitor element according to an embodiment of the present invention.

FIG. 2 shows a stacked solid capacitor element according to an embodiment of the present disclosure. The basic structure of the stacked solid capacitor element is similar to that of the wound solid capacitor element. The capacitor element 20 has an anode electrode 21, a solid electrolyte layer 22, and a cathode electrode 23. The anode electrode 21 is formed by roughening the surface of a metal foil, and forming a dielectric layer (not shown) made of an oxide or the like on the roughened surface. The solid electrolyte layer 22 made of the conductive polymer, and the cathode electrode 23 are sequentially stacked on the dielectric layer. After a plurality of capacitor elements 20 are stacked together, a stacked solid capacitor element 200 is formed.

The solid electrolyte layer 22 is formed between the dielectric layer and the cathode foil of the solid capacitor by impregnating the capacitor element in a solution containing the conductive polymer material according to the present disclosure. In a specific embodiment of the present disclosure, compared to a conductive polymer material which does not have structural units containing an ethylenically unsaturated group, the conductive polymer material according to the present disclosure can effectively improve the withstand voltage when applied to a stacked solid capacitor.

The following specific implementations are used to further illustrate the present disclosure. However, the description is only used to illustrate, and not intended to limit the scope of the present disclosure. Modifications and changes readily made by any persons of skill in the art are contemplated in the disclosure of the specification and the protection scope of the claims of the present disclosure.

EXAMPLES

Preparation of Conductive Polymer

Comparative Example 1

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.6 g (4.22 mmol) of

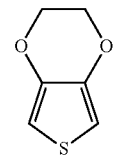

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Comparative Example 2

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

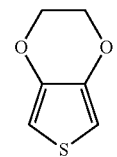

and 0.1 g (0.5 mmol) of

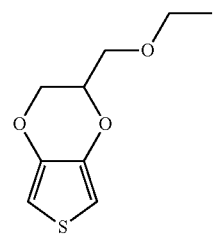

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Comparative Example 3

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

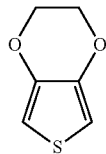

and 0.1 g (0.54 mmol) of

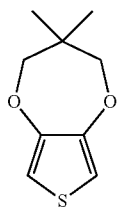

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Comparative Example 4

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

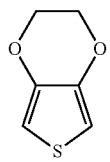

and 0.1 g (0.89 mmol) of

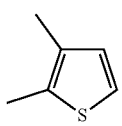

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 1-1

100 g of pure water and 5 g of polystyrene sulfonic acid [Alfa Acsar, CAS NO:28210-41-5, 30% aq. Mw: 1,000,000] were added to a reaction vessel, and stirred until uniform at room temperature. Then 3.5 g of 1% iron(III) sulfate aqueous solution, 0.5 g (3.52 mmol) of

and 0.1 g (0.47 mmol) of

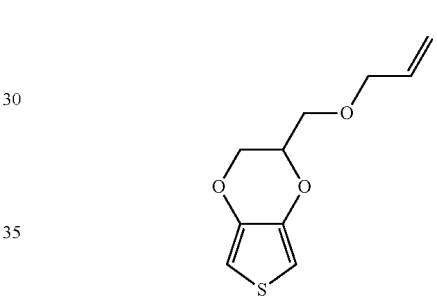

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 1-2

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

and 0.1 g (0.47 mmol) of

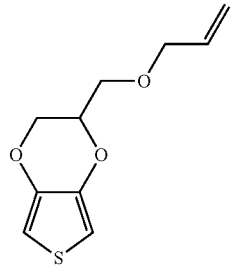

were added, and stirred for 2 h. Then 0.237 g (0.99 mmol) of sodium peroxydisulfate was added, and stirred at room temperature for 46 h for polymerization. After the reaction was completed, the inorganic salts were removed to obtain a conductive polymer material.

Example 1-3

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

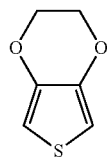

and 0.1 g (0.47 mmol) of

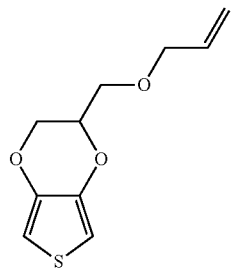

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 2

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

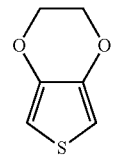

and 0.05 g (0.20 mmol) of were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 3

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

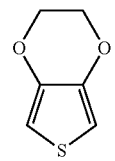

and 0.1 g (0.35 mmol) of

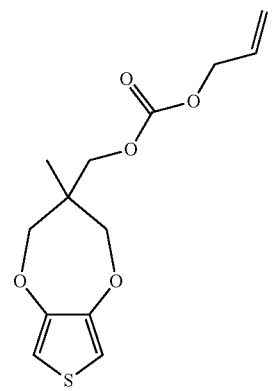 [SMILES: C=CCOC(=O)OCC1(C)COc2cscc2OC1]

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 4

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

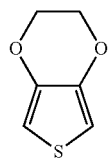

and 0.1 g (0.42 mmol) of

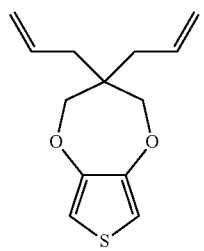 [SMILES: C=CCC1(CC=C)COc2cscc2OC1]

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 5

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

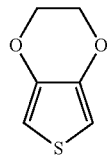

and 0.05 g (0.30 mmol) of

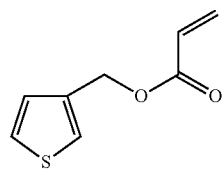

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 6

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

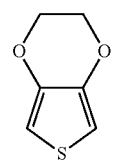

and 0.1 g (0.37 mmol) of

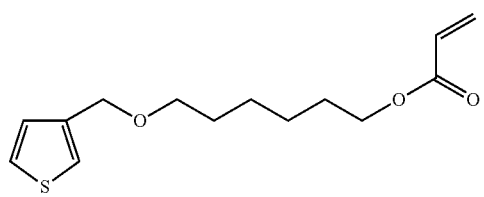 [SMILES: C=CC(=O)OCCCCCCOCc1ccsc1]

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 7

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

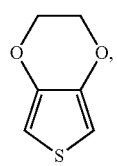

0.05 g (0.24 mmol) of

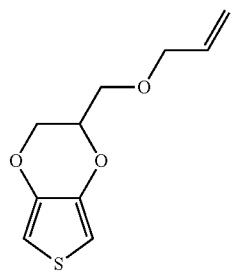

and 0.05 g (0.30 mmol) of

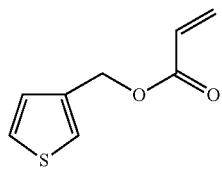

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 8

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III)sulfate aqueous solution, 0.5 g (3.52 mmol) of

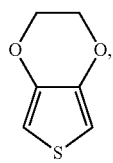

0.1 g (0.4 mmol) of

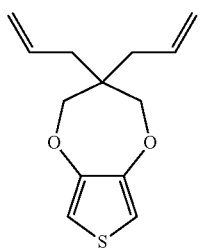 [SMILES: C=CCC1(CC=C)COc2cscc2OC1]

and 0.1 g (0.4 mmol) of

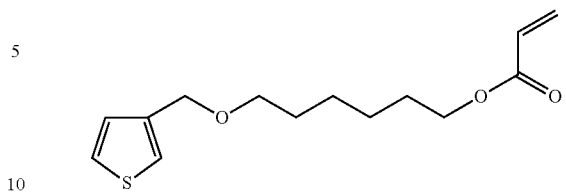

were added, and stirred for 2 h. Then 0.237 g (0.99 mmol) of sodium peroxydisulfate was added, and stirred at room temperature for 23 h for polymerization. After the reaction was completed, the inorganic salts were removed to obtain a conductive polymer material.

Example 9

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

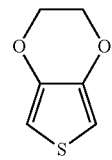

were added, and stirred for 2 h. 0.237 g (0.99 mmol) of sodium peroxydisulfate was added, and stirred at room temperature for 16 h for polymerization. Then 0.1 g (0.8 mmol) of

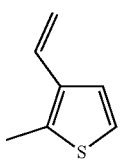

was added and the reaction was continued for 7 h. After the reaction was completed, the inorganic salts were removed to obtain a conductive polymer material.

Example 10

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

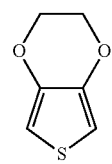

were added, and stirred for 2 h. 0.237 g (0.99 mmol) of sodium peroxydisulfate was added, and stirred at room temperature for 16 h for polymerization. Then 0.03 g (0.20 mmol) of

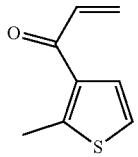

was added and the reaction was continued for 7 h. After the reaction was completed, the inorganic salts were removed to obtain a conductive polymer material.

Example 11

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

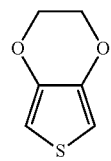

were added, and stirred for 2 h. 0.237 g (0.99 mmol) of sodium peroxydisulfate was added, and stirred at room temperature for 16 h for polymerization. Then 0.1 g (0.7 mmol) of

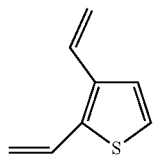

was added and the reaction was continued for 7 h. After the reaction was completed, the inorganic salts were removed to obtain a conductive polymer material.

Example 12

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

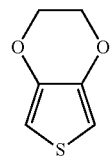

were added, and stirred for 2 h. 0.237 g (0.99 mmol) of sodium peroxydisulfate was added, and stirred at room temperature for 16 h for polymerization. Then 0.2 g (0.9 mmol) of

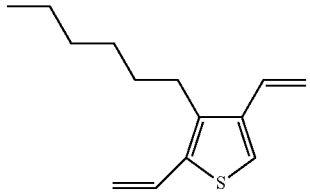

was added and the reaction was continued for 7 h. After the reaction was completed, the inorganic salts were removed to obtain a conductive polymer material.

Example 13

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

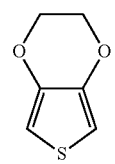

were added, and stirred for 2 h. 0.237 g (0.99 mmol) of sodium peroxydisulfate was added, and stirred at room temperature for 16 h for polymerization. Then 0.006 g (0.05 mmol) of

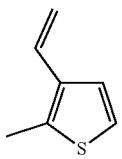

and 0.02 g (0.15 mmol) of

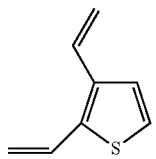

were added and the reaction was continued for 7 h. After the reaction was completed, the inorganic salts were removed to obtain a conductive polymer material.

Example 14

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

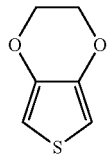

were added, and stirred for 2 h. 0.237 g (0.99 mmol) of sodium peroxydisulfate was added, and stirred at room temperature for 16 h for polymerization. Then 0.05 g (0.33 mmol) of

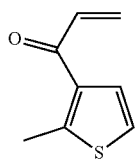

and 0.01 g (0.05 mmol) of

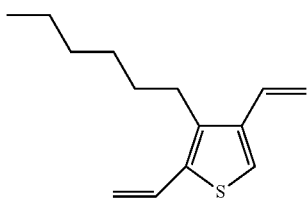

were added and the reaction was continued for 7 h. After the reaction was completed, the inorganic salts were removed to obtain a conductive polymer material.

Example 15

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

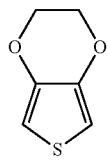

were added, and stirred for 2 h. 0.237 g (0.99 mmol) of sodium peroxydisulfate was added, and stirred at room temperature for 16 h for polymerization. Then 0.01 g (0.08 mmol) of

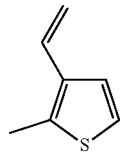

was added and the reaction was continued for 7 h. After the reaction was completed, the inorganic salts were removed to obtain a conductive polymer material.

Example 16

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

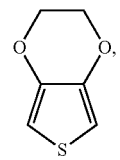

0.05 g (0.21 mmol) of

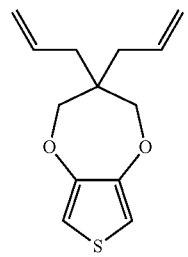 [SMILES: C=CCC1(CC=C)COc2cscc2OC1]

and 0.1 g (0.37 mmol) of

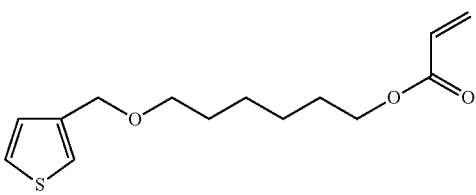 [SMILES: C=CC(=O)OCCCCCCOCc1ccsc1]

were added, and stirred for 2 h. 0.237 g (0.99 mmol) of sodium peroxydisulfate was added, and stirred at room temperature for 16 h for polymerization. Then 0.03 g (0.20 mmol) of

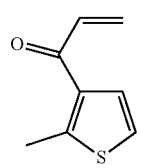

was added and the reaction was continued for 7 h. After the reaction was completed, the inorganic salts were removed to obtain a conductive polymer material.

Example 17

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution, 0.5 g (3.52 mmol) of

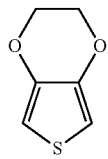

and 0.05 g (0.20 mmol) of

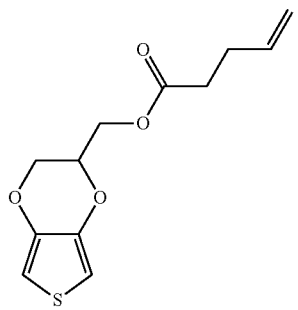 [SMILES: C=CCCC(=O)OCC1COc2cscc2O1]

were added, and stirred for 2 h. 0.237 g (0.99 mmol) of sodium peroxydisulfate was added, and stirred at room temperature for 23 h for polymerization. After the reaction was completed, the inorganic salts were removed and 0.01 g (0.07 mmol) of

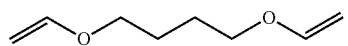

was added and a conductive polymer material was thus obtained.

Example 18

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

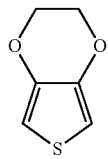

were added, and stirred for 2 h. 0.237 g (0.99 mmol) of sodium peroxydisulfate was added, and stirred at room temperature for 16 h for polymerization. Then 0.01 g (0.08 mmol) of

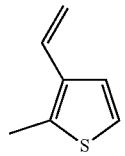

was added and the reaction was continued for 7 h. After the reaction was completed, the inorganic salts were removed and 2 g (0.1 mmol) of

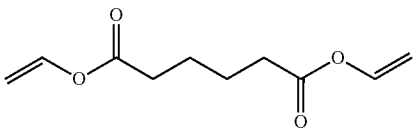

was added and a conductive polymer material was thus obtained.

Example 19

100 g of pure water and 5 g of polystyrene sulfonic acid [Alfa Acsar, CAS NO:28210-41-5, 30% aq. Mw: 75,000] were added to a reaction vessel, and stirred until uniform at room temperature. Then 3.5 g of 1% iron(III) sulfate aqueous solution and 0.5 g (3.52 mmol) of

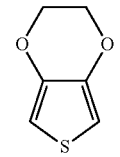

were added, and stirred for 2 h. 0.237 g (0.99 mmol) of sodium peroxydisulfate was added, and stirred at room temperature for 16 h for polymerization. Then 0.01 g (0.08 mmol) of

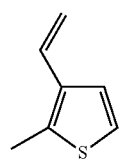

and 0.01 g (0.07 mmol) of

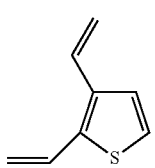

was added and the reaction was continued for 7 h. After the reaction was completed, the inorganic salts were removed and 4 g (0.2 mmol) of

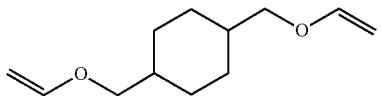

was added and a conductive polymer material was thus obtained.

Manufacturing of Wound Solid Capacitor

The capacitor element 9 shown in FIG. 1 was impregnated in the conductive polymer material prepared in the comparative examples and examples for 5 min. Then the impregnated capacitor element 9 was taken out and dried by heating at a temperature of 150° C. This process was repeated three times. Then a solid electrolyte was formed.

The capacitor element 9 containing the solid electrolyte was placed in a box with a bottom, and then the box was sealed and wires were exposed to complete the manufacturing of a solid capacitor.

Manufacturing of Stacked Solid Capacitor

The capacitor element 200 without a solid electrolyte layer 22 shown in FIG. 2 was impregnated in the conductive polymer material prepared in the examples and comparative examples for 5 min. Then the impregnated capacitor element 200 was taken out and dried by heating at a temperature of 150° C. This process was repeated three times. Then a solid electrolyte was formed.

The capacitor element 200 containing the solid electrolyte was placed in a box with a bottom, and then the box was sealed and wires were exposed to complete the manufacturing of a solid capacitor.

Test of Physical Properties of Conductive Polymer Material

HORIBA LB-550 was used to determine the average particle size (d50) of the conductive polymer materials prepared in the examples and comparative examples by the laser diffraction method. WATERS 2414 and WATERS 2695 were used to determine the weight average molecular weight of the prepared conductive polymer materials. The measurement results are listed in Table 1 below.

Test of Physical Properties of Solid Capacitor

The HP4284A LCR meter was used to measure the capacitance of the manufactured solid capacitors at a temperature of 20° C. and a frequency of 120 Hz. The Chroma Model 11200 Capacitor Leakage Current/Insulation Resistance Meter was used to measure the withstand voltage of the manufactured solid capacitors, and measure the properties of the manufactured solid capacitors. The measurement results are listed in Table 1 and Table 2.

TABLE 1

(wound solid capacitor)

| | Capacitance (CS) (μF, 120 Hz) Cs(μF) | Df (%) | ESR (mΩ) | Breakdown Voltage (V) | d50 [nm] | Mw |
|---|---|---|---|---|---|---|
| Comp. Example 1 | 6.38 | 4.4 | 29 | 219 | 20 | 110,354 |
| Comp. Example 2 | 6.1 | 7.1 | 45 | 225 | 35 | 87,373 |
| Comp. Example 3 | 6.01 | 4.3 | 35 | 218 | 36 | 92,856 |
| Comp. Example 4 | 6.21 | 5.1 | 27 | 210 | 30 | 130,458 |
| Example 1-1 | 3.28 | 11.3 | 103 | 332 | 123 | 121,861 |
| Example 1-2 | 5.68 | 6.3 | 59 | 230 | 85 | 518,134 |
| Example 1-3 | 6.40 | 4.2 | 28 | 320 | 11 | 79,911 |
| Example 2 | 6.56 | 3.2 | 27 | 310 | 10 | 126,608 |
| Example 3 | 6.10 | 8.0 | 31 | 305 | 36 | 131,344 |
| Example 4 | 6.01 | 5.0 | 26 | 332 | 40 | 94,573 |
| Example 5 | 6.11 | 8.0 | 66 | 310 | 35 | 88,692 |
| Example 6 | 6.34 | 6.1 | 55 | 315 | 20 | 110,012 |
| Example 7 | 6.30 | 6.7 | 51 | 321 | 21 | 99,681 |
| Example 8 | 6.15 | 9.2 | 59 | 351 | 36 | 100,438 |
| Example 9 | 5.76 | 6.8 | 42 | 348 | 61 | 93,582 |
| Example 10 | 5.94 | 10.6 | 50 | 28 | 39 | 118,300 |
| Example 11 | 5.66 | 8.8 | 63 | 341 | 79 | 90,873 |
| Example 12 | 5.75 | 9.7 | 52 | 355 | 70 | 127,880 |
| Example 13 | 6.33 | 7.6 | 77 | 308 | 15 | 109,164 |
| Example 14 | 6.40 | 9.9 | 85 | 305 | 12 | 115,903 |
| Example 15 | 5.76 | 10.1 | 88 | 251 | 71 | 108,551 |
| Example 16 | 6.29 | 11.8 | 76 | 342 | 21 | 106,652 |
| Example 17 | 6.15 | 3.3 | 29 | 315 | 18 | 83,637 |
| Example 18 | 5.81 | 7.1 | 48 | 285 | 58 | 121,581 |
| Example 19 | 6.07 | 7.8 | 82 | 310 | 31 | 100,068 |

TABLE 2

(stacked solid capacitor)

| | Capacitance (CS) (μF, 120 Hz) Cs (μF) | Df (%) | ESR (mΩ) | Breakdown Voltage (V) |
|---|---|---|---|---|
| Comp. Example 1 | 316 | 5.6 | 10 | 23 |
| Comp. Example 2 | 300 | 7.5 | 13 | 22 |
| Comp. Example 3 | 295 | 6.4 | 17 | 21 |
| Comp. Example 4 | 308 | 5.9 | 11 | 23 |
| Example 1-1 | 203 | 12.1 | 36 | 26 |
| Example 1-2 | 276 | 8.3 | 20 | 20 |
| Example 1-3 | 304 | 3.8 | 9 | 29 |
| Example 2 | 312 | 4.5 | 9 | 31 |
| Example 3 | 309 | 8.2 | 11 | 28 |
| Example 4 | 296 | 4.5 | 13 | 28 |
| Example 5 | 305 | 5.4 | 9 | 25 |
| Example 6 | 319 | 7.5 | 15 | 26 |
| Example 7 | 310 | 3.8 | 14 | 32 |
| Example 8 | 315 | 4.7 | 17 | 35 |
| Example 9 | 307 | 8.2 | 14 | 36 |
| Example 10 | 297 | 4.5 | 15 | 26 |
| Example 11 | 302 | 5.4 | 16 | 27 |
| Example 12 | 298 | 8.6 | 19 | 36 |
| Example 13 | 300 | 9 | 19 | 26 |
| Example 14 | 293 | 10.1 | 21 | 26 |
| Example 15 | 285 | 5.8 | 25 | 24 |
| Example 16 | 306 | 8.7 | 21 | 32 |
| Example 17 | 310 | 4.8 | 10 | 26 |
| Example 18 | 307 | 8.5 | 15 | 31 |
| Example 19 | 301 | 9.5 | 22 | 33 |

From the results in Tables 1 and 2, it can be seen that the conductive polymer of the present disclosure can increase the withstand voltage to 230 V or 250 V or higher when applied to a wound solid capacitor, and can also increase the withstand voltage to 24 V or higher when applied to a stacked solid capacitor (except for Example 1-2), thus being better than the conductive polymers of Comparative Examples 1 to 4.

From the results of Examples 1-2 and 1-3, it can be seen that when the conductive polymer has a weight average molecular weight between 75,000 and 500,000, the storage capacity can be further increased and the ESR can be reduced. In addition, the withstand voltage is also improved.

From the results of Examples 1-1 and 1-3, it can be seen that when the conductive polymer has an average particle size (d50) in the range of about 10 nm to about 100 nm, the storage capacity and withstand voltage can be further improved and the ESR can be reduced.

Washing Resistance Test

A polyester fiber fabric was washed with deionized water, dried and cut into strips of 10*8 cm².

The treated polyester fiber fabric was immersed in a conductive polymer solution (Examples 1 to 19 and Comparative Examples 1 to 4). After padding, it was heat-dried at 130° C. to obtain a water washing-resistant conductive textile. The surface impedance (resistance before water washing) was measured by a desktop low resistivity meter (model LORESTA-GP MCP-T600). The water washing-resistant conductive textile was washed in pure water at a temperature of 25° C. for 15 min and then dewatered; and then washed in pure water at a temperature of 25° C. for 15 min and dewatered again, heat-dried at 130° C., and the surface resistance (resistance after water washing) was measured.

TABLE 3

| | Resistance before water washing (Ω/□) | Resistance after water washing (Ω/□) | Resistance increase rate (%) |
|---|---|---|---|
| Comp. Example 1 | 700 | 6000 | 757.1% |
| Comp. Example 2 | 810 | 7000 | 764.2% |
| Comp. Example 3 | 820 | 8000 | 875.6% |
| Comp. Example 4 | 780 | 6700 | 759.0% |
| Example 1-1 | 1500 | 8000 | 433.3% |
| Example 1-2 | 910 | 4600 | 405.5% |
| Example 1-3 | 700 | 2300 | 228.6% |
| Example 2 | 700 | 2000 | 185.7% |
| Example 3 | 700 | 2500 | 257.1% |
| Example 4 | 800 | 3000 | 275.0% |
| Example 5 | 800 | 3500 | 337.5% |
| Example 6 | 800 | 3200 | 300.0% |
| Example 7 | 800 | 3800 | 375.0% |
| Example 8 | 900 | 4000 | 344.4% |
| Example 9 | 1300 | 4000 | 207.7% |
| Example 10 | 1500 | 4000 | 166.7% |
| Example 11 | 900 | 1500 | 66.7% |
| Example 12 | 1000 | 1700 | 70.0% |
| Example 13 | 1000 | 2500 | 150.0% |
| Example 14 | 1000 | 2800 | 180.0% |
| Example 15 | 3000 | 4000 | 33.3% |
| Example 16 | 2000 | 3000 | 50.0% |
| Example 17 | 760 | 1900 | 119.9% |
| Example 18 | 1450 | 3000 | 106.8% |
| Example 19 | 1300 | 2000 | 53.8% |

It can be seen from the results in Table 3 that the resistance increase rate of the conductive textiles of Comparative Examples 1 to 4 after water washing is as high as 757.1% or more. The use of the conductive polymer of the present disclosure can greatly reduce the resistance increase rate of the textile after water washing, and give rise to a good water washing resistance.

In addition, from the results of Examples 1-2 and 1-3, it can be seen that when the conductive polymer has a weight average molecular weight between 75,000 and 500,000, a better water washing resistance can be obtained. From the results of Examples 1-1 and 1-3, it can be seen that when the conductive polymer has an average particle size (d50) in the range of about 10 nm to about 100 nm, a better water washing resistance can be obtained.

The above-described embodiments of the present disclosure are intended to be illustrative only. Numerous alternative embodiments may be devised by persons skilled in the art without departing from the scope of the following claims.

What is claimed is:

1. A conductive polymer material, comprising a conductive polymer having structural units derived from the following monomers:
   (a) a monomer of formula (I):

wherein:
   X is O or S,
   A is $C_{1-4}$ alkylene optionally substituted by (R) p,
   R is $C_{1-20}$ alkyl, $C_{1-20}$ alkoxy or $C_{6-20}$ aryl,
   P is 0, 1 or 2; and
   (b) a monomer having an ethylenically unsaturated group which has the following formula:

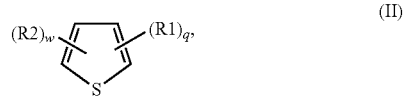

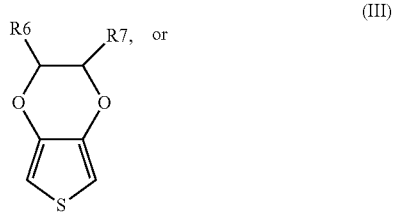

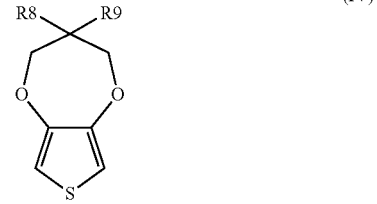

wherein:
   R1, R7 and R9 are each independently -D-E-F-G;
   R6 and R8 are each independently H, $C_{1-4}$ alkyl or -D-E-F-G;
   D is a bond or $C_{1-6}$ alkylene;
   E is a bond or $C_{1-20}$ alkoxylene;
   F is a bond, —C(=O)—, —O—C(=O)— or —O—C(=O)—O—;
   G is —($C_{1-4}$ alkylene)$_y$—CH=CH$_2$;

R2 is $C_{1-20}$ alkyl;
q is 1, 2 or 3;
w is 0 or 1; and
y is 0 or 1;
  wherein the weight average molecular weight of the conductive polymer is between 75,000 and 500,000; and
  wherein the conductive polymer material has an average particle size ranging from about 10 nm to about 100 nm.

2. A conductive polymer material, comprising a conductive polymer having structural units derived from the following monomers:
(a) a monomer of formula (I):

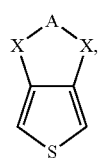
(I)

wherein:
X is O or S,
A is $C_{1-4}$ alkylene optionally substituted by $(R)_p$,
R is $C_{1-20}$ alkyl, $C_{1-20}$ alkoxy or $C_{6-20}$ aryl,
P is 0, 1 or 2; and
(b) a monomer having an ethylenically unsaturated group which has the following formula:

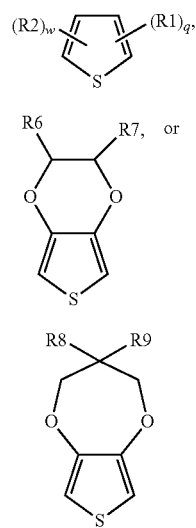
(II)
(III)
(IV)

wherein:
R1, R7 and R9 are each independently -D-E-F-G;
R6 and R8 are each independently H, $C_{1-4}$ alkyl or -D-E-F-G;
D is a bond or $C_{1-6}$ alkylene;
E is a bond or $C_{1-20}$ alkoxylene;
F is a bond, —C(=O)—, —O—C(=O)— or —O—C(=O)—O—;
G is —$(C_{1-4}$ alkylene$)_y$—CH=CH$_2$;
R2 is $C_{1-20}$ alkyl;
q is 1, 2 or 3;
w is 0 or 1; and
y is 0 or 1; and
  wherein the conductive polymer material has an average particle size ranging from about 10 nm to about 100 nm.

3. The conductive polymer material according to claim 2, wherein the monomer of formula (I) is selected from a group consisting of the following:

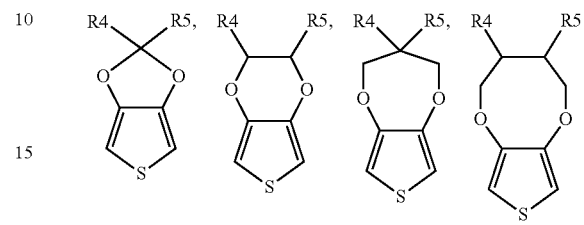

and a combination thereof,
  wherein R4 and R5 are each independently H, unsubstituted or substituted $C_{1-15}$ alkyl or $C_{1-15}$ alkoxy, or unsubstituted or substituted $C_{6-15}$ aryl.

4. The conductive polymer material according to claim 2, wherein R1 is each preferably independently:

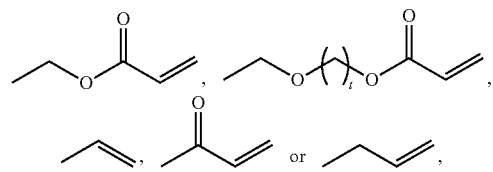

in which t is an integer of 1-20.

5. The conductive polymer material according to claim 2, wherein R7 and R9 are each independently:

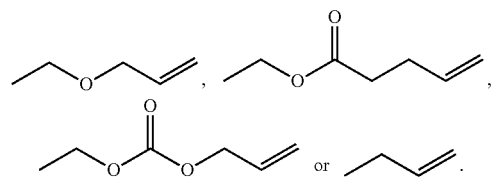

6. The conductive polymer material according to claim 2, wherein R6 and R8 are each independently: H, methyl, ethyl, —CH$_2$—CH=CH$_2$ or —C$_2$H$_4$—CH=CH$_2$.

7. The conductive polymer material according to claim 2, wherein G is —CH=CH$_2$, —CH$_2$—CH=CH$_2$ or —C$_2$H$_4$—CH=CH$_2$.

8. The conductive polymer material according to claim 2, wherein (b) the monomer having an ethylenically unsaturated group is selected from a group consisting of the following:

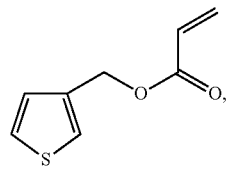

-continued

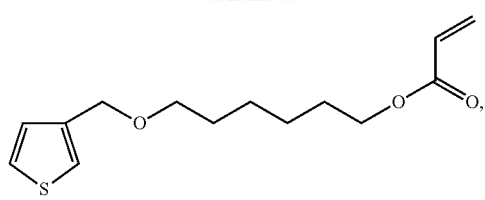

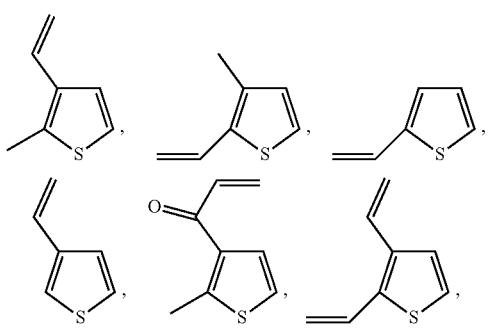

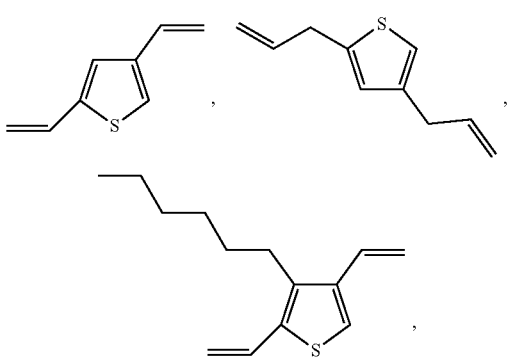

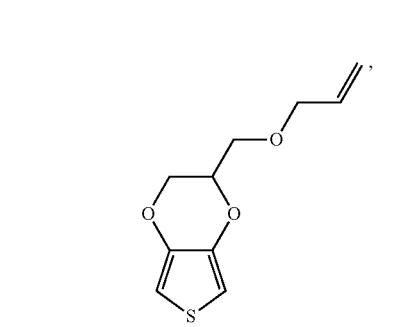

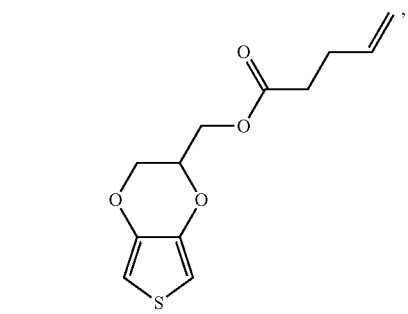

-continued

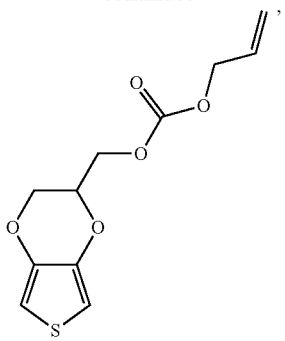

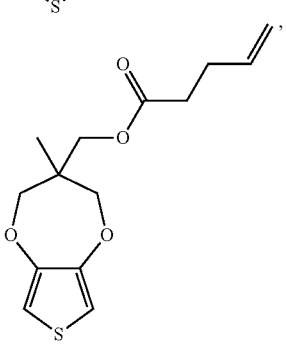

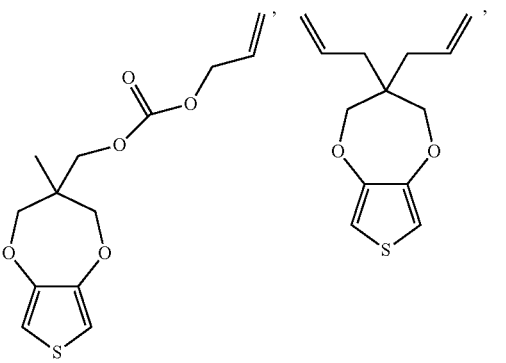

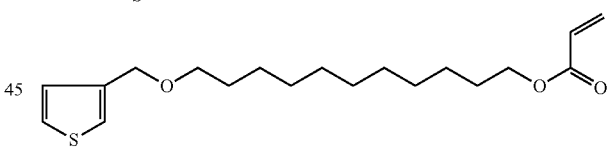

and a combination thereof.

9. The conductive polymer material according to claim 2, wherein the mole ratio of component (a) to the monomer having an ethylenically unsaturated group (component (b)) ranges from 1:1 to 1:0.005.

10. The conductive polymer material according to claim 2, further comprising polyanion.

11. The conductive polymer material according to claim 2, further comprising divinyl ester or divinyl ether.

12. A product comprising the conductive polymer material of claim 2, wherein the product is selected from the group consisting of smart fabrics, antistatic coatings, solid capacitors and hybrid capacitors.

13. A conductive polymer material, comprising a conductive polymer having structural units derived from the following monomers:

(a) a monomer of formula (I):

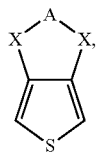
(I)

wherein:

X is O or S,

A is $C_{1-4}$ alkylene optionally substituted by $(R)_p$,

R is $C_{1-20}$ alkyl, $C_{1-20}$ alkoxy or $C_{6-20}$ aryl,

P is 0, 1 or 2; and (b) a monomer having an ethylenically unsaturated group which has the following formula:

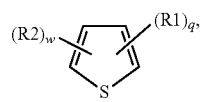
(II)

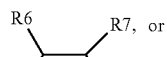
(III)

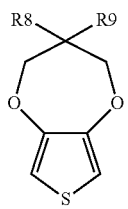
(IV)

wherein:

R1, R7 and R9 are each independently -D-E-F-G;

R6 and R8 are each independently H, $C_{1-4}$ alkyl or -D-E-F-G;

D is a bond or $C_{1-6}$ alkylene;

E is a bond or $C_{1-20}$ alkoxylene;

F is a bond, —C(=O)—, —O—C(=O)— or —O—C(=O)—O—;

G is —($C_{1-4}$ alkylene)$_y$—CH=CH$_2$;

R2 is $C_{1-20}$ alkyl;

q is 1, 2 or 3;

w is 0 or 1; and y is 0 or 1; and wherein the conductive polymer material further comprises divinyl ester or divinyl ether.

14. The conductive polymer material according to claim 13, wherein the monomer of formula (I) is selected from a group consisting of the following:

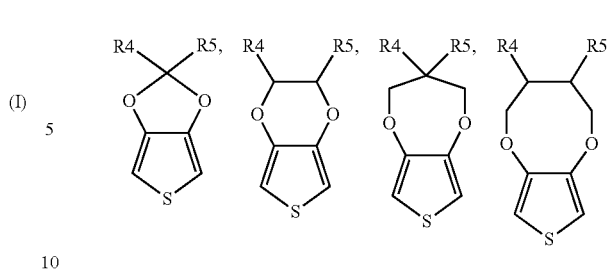

and a combination thereof, wherein R4 and R5 are each independently H, unsubstituted or substituted $C_{1-15}$ alkyl or $C_{1-15}$ alkoxy, or unsubstituted or substituted $C_{6-15}$ aryl.

15. The conductive polymer material according to claim 13, wherein R1 is each independently:

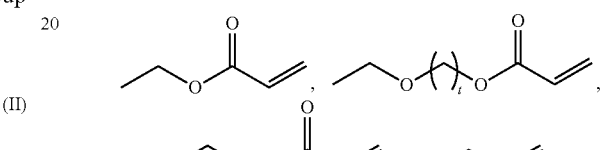

in which t is an integer of 1-20.

16. The conductive polymer material according to claim 13, wherein R7 and R9 are each independently:

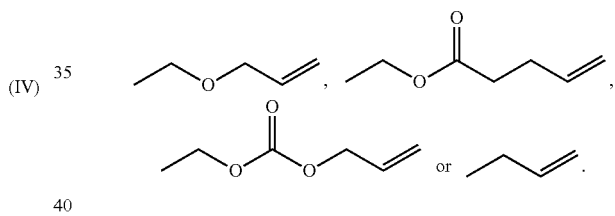

17. The conductive polymer material according to claim 13, wherein R6 and R8 are each independently: H, methyl, ethyl, —CH$_2$—CH=CH$_2$ or —C$_2$H$_4$—CH=CH$_2$.

18. The conductive polymer material according to claim 13, wherein G is —CH=CH$_2$, —CH$_2$—CH=CH$_2$ or —C$_2$H$_4$—CH=CH$_2$.

19. The conductive polymer material according to claim 13, wherein (b) the monomer having an ethylenically unsaturated group is selected from a group consisting of the following:

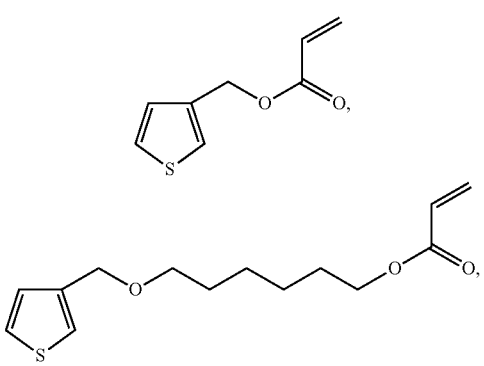

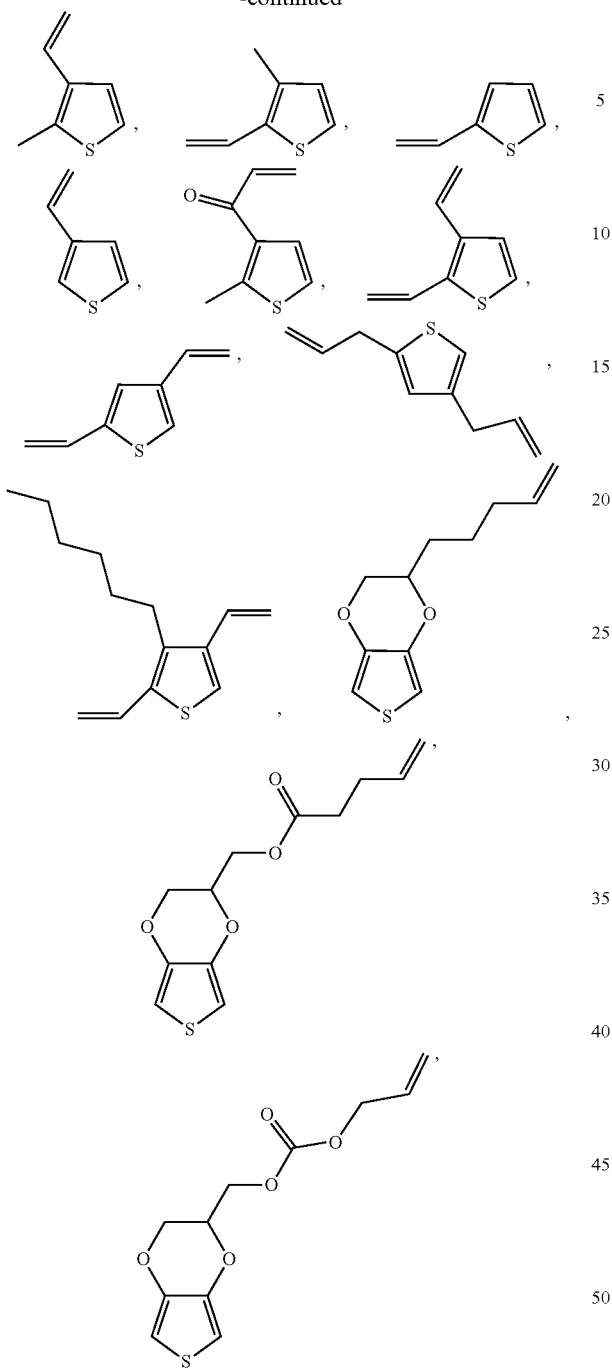
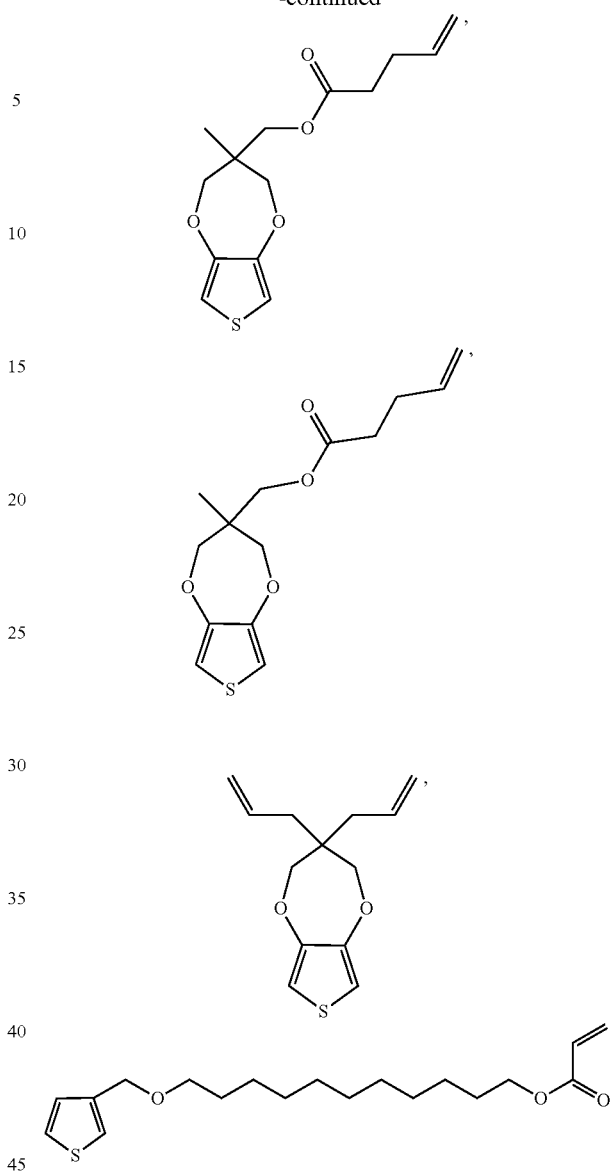
and a combination thereof.
20. The conductive polymer material according to claim 13, wherein the mole ratio of component (a) to the monomer having an ethylenically unsaturated group (component (b) ranges from 1.1 to 1:0.005.
* * * * *